United States Patent [19]

Pfennings

[11] Patent Number: 4,823,319
[45] Date of Patent: Apr. 18, 1989

[54] INTEGRATED MEMORY CIRCUIT HAVING COMPLEMENTARY BIT LINE CHARGING

[75] Inventor: Leonardus C. M. G. Pfennings, Eindhoven, Netherlands

[73] Assignee: U.S. Philips Corporation, New York, N.Y.

[21] Appl. No.: 39,400

[22] Filed: Apr. 17, 1987

[30] Foreign Application Priority Data

Sep. 29, 1986 [NL] Netherlands ............. 8602450

[51] Int. Cl.⁴ .................................. G11C 7/00
[52] U.S. Cl. ............................ 365/189; 365/190; 365/203; 365/51
[58] Field of Search ............. 365/189, 203, 204, 230, 365/51, 190, 154, 185–187; 307/530

[56] References Cited

U.S. PATENT DOCUMENTS

| | | | |
|---|---|---|---|
| 3,848,236 | 11/1974 | Troutman | 365/204 |
| 3,949,382 | 4/1976 | Yasui | 365/204 |
| 4,133,611 | 1/1979 | Baker | 365/203 |
| 4,287,571 | 9/1981 | Chakravarti et al. | 365/184 |
| 4,715,014 | 12/1987 | Tuvell et al. | 365/187 |

FOREIGN PATENT DOCUMENTS 55-157194 12/1980 Japan ...................... 365/190

Primary Examiner—Stuart N. Hecker
Assistant Examiner—Alfonso Garcia
Attorney, Agent, or Firm—Steven R. Biren

[57] ABSTRACT

In a memory cell which is connected between two bit lines, information is stored after selection by causing a first bit line to convey a signal which is complementary to that on a second bit line. It is known, starting from a single data supply line which may convey either a high or a low signal, to provide a memory circuit per column with inverting means so as to be able to charge both bit lines complementarily. Here, this complementary charging is done by connecting, upon selection, the first bit line to the data supply line and connecting a transistor with its main electrodes between ground and the second bit line, which transistor receives the data at its control electrode. This transistor then constitutes, with the bit line load, an inverter. Lay-out aspects relate to the common use of substrate area of two adjacent columns and the common use of a contact in the shown circuit arrangement.

5 Claims, 3 Drawing Sheets

INTEGRATED MEMORY CIRCUIT HAVING COMPLEMENTARY BIT LINE CHARGING

BACKGROUND OF THE INVENTION

The invention relates to an integrated memory circuit in which memory cells are arranged in columns and in which each column is connected to two bit lines, and in which, for writing information into a memory cell of a column, that memory cell can be selected by means of selection means, which selection means connect the memory cell to the two bit lines and connect the two bit lines to a data bus for supplying information to the memory cell, each of the two bit lines being connected, via a respective load, to a first supply terminal, the data bus comprising a line which supplies a signal to a first bit line, inverting means being provided per column that generate a logically complementary signal on a second bit line.

Such a memory circuit is disclosed in U.S. Pat. No. 4,133,611. In this circuit arrangement the bit of information, present on a single data supply line, is set on the bit lines of the selected column in such a manner that from the data supply line the non-inverted signal passes a first and second inverting amplifier before appearing on the first bit line, while from the same data supply line the non-inverted signal passes a third inverting amplifier before appearing on the second bit line in the inverted form (FIG. 18c). The second and third amplifiers, both constructed as tri-state amplifiers, also play the role of access gate to the column. Another prior art memory circuit having, upon selection, a direct connection between a data input and a bitline, and an inverter between the data input and a second bitline is shown in FIG. 1 of German Patent Application DE-3430144.

In the first-mentioned reference an inverting amplifier comprises at least two transistors and a tri-stage amplifier comprises at least four transistors, which amplifiers must have connections to the supply lines. This involves that between the single data supply line and the memory cells connected to the two bit lines of a column at least ten transistors are present as well as the necessary supply source connections. In order to save area on the memory IC it is desirable to restrict the number of components between data supply lines and memory cell column. Furthermore it is desirable to keep the number of connection points to the supply lines as small as possible, because said connections should be as large as possible in the lay-out for reasons of reliability.

SUMMARY OF THE INVENTION

It is an object of the present invention to provide an integrated memory circuit in which the selection and connection means between write bus and bit lines have been realized on a smaller substrate area.

An integrated memory circuit according to the invention is characterized in that upon selecting a column the first bit line in said column is connected to the data bus and the second bit line in said column is connected to a second supply terminal via a first transistor whose control electrode is connected to the data bus. The selection of a column in a circuit arrangement according to the invention is carried out via transfer transistors, which is a column selection mode known per se (JP-Kokai No. 60-129997.

The advantage of a memory circuit according to the invention is that access gates and inverting means comprise only three transistors per column and one contact to the second supply terminal ($V_{SS}$), whereas the prior art uses at least ten transistors and at least two contacts to the two supply terminals ($V_{DD}$ and $V_{SS}$).

The operation of the circuit arrangement according to the invention is based on the use per column of the load, via which the second bit line is connected to the first supply terminal, as a part of an inverter, which is formed by said load and the first transistor.

Due to the absence of a $V_{DD}$-contact in the area between memory cell column and data bus, a $V_{DD}$ supply line is omitted there, which leads to a further reduction of the required substrate area.

A first embodiment of a memory circuit in accordance with the invention is characterized in that upon selecting one of two juxtaposed columns the respective second bit line is connected to the second supply terminal via a first transistor which is common to both columns. This common use of one first transistor as well as one contact to $V_{SS}$ further reduces the required substrate area.

A second embodiment of a memory circuit in accordance with the invention is characterized in that of two juxtaposed columns in a lay-out of the memory circuit a first bit line of a first column crosses a second bit line of a second column between column selection lines belonging to said two columns and an area in which all the memory cells of said two columns are present. Because column selection means are provided per column which should be realized in the area between column selection lines and the memory cells, a smaller substrate area is used by arranging the selection means, as well as the first transistors, per pair of columns on an area which is common per pair of columns. For the optimum arrangement, both the selection means and the first transistors, as well as the bit lines should be interweaved in said area, both first transistors using one common connection point to $V_{SS}$.

Further embodiments relate to the common use in the lay-out of single contacts to the data bus and to $V_{SS}$ for two juxtaposed columns and will be further described hereinafter.

BRIEF DESCRIPTION OF THE DRAWING

The invention will now be described in greater detail with reference to figures shown in the drawing, in which.

DESCRIPTION OF THE PREFERRED EMBODIMENTS

Figure 1:
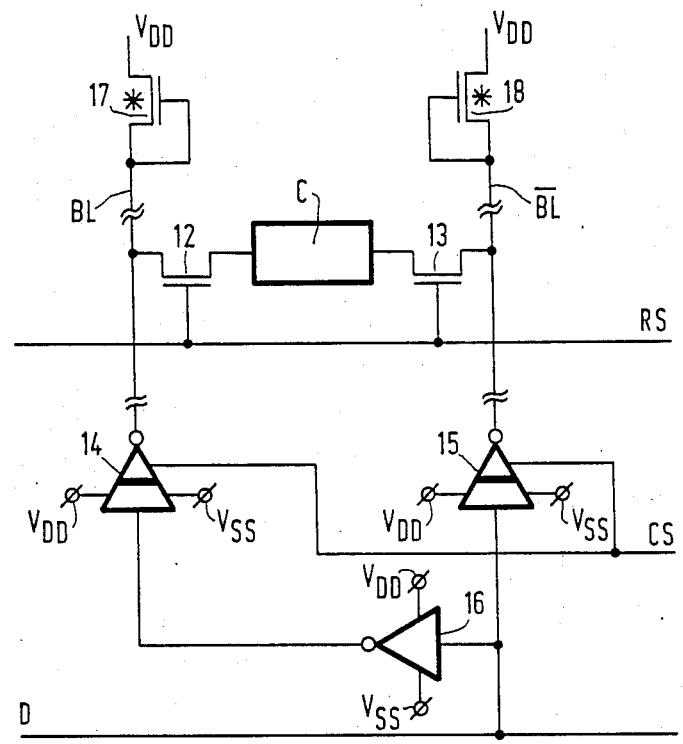
FIG. 1 shows a prior art circuit arrangement.

FIG. 1 shows a part of a prior art memory circuit. For reasons of clarity only one memory cell C of a column of memory cells is shown which can be connected by means of the row selection RS via the access transistors 12 and 13 to the bit lines BL and $\overline{BL}$, which are connected, via bit line loads 17 and 18 respectively to supply terminal $V_{pp}$. The column selection CS can make the bit lines accessible for the information on the data bus D via access gates 14 and 15 formed by tristate inverters. The information which is to be stored in the cell C first passes an inverting amplifier 16 and then a tristate inverter 14 before turning up on bit line BL, while the information which appears on bit line $\overline{BL}$ in the inverted form passes the tristate inverter 15.

Figure 2:
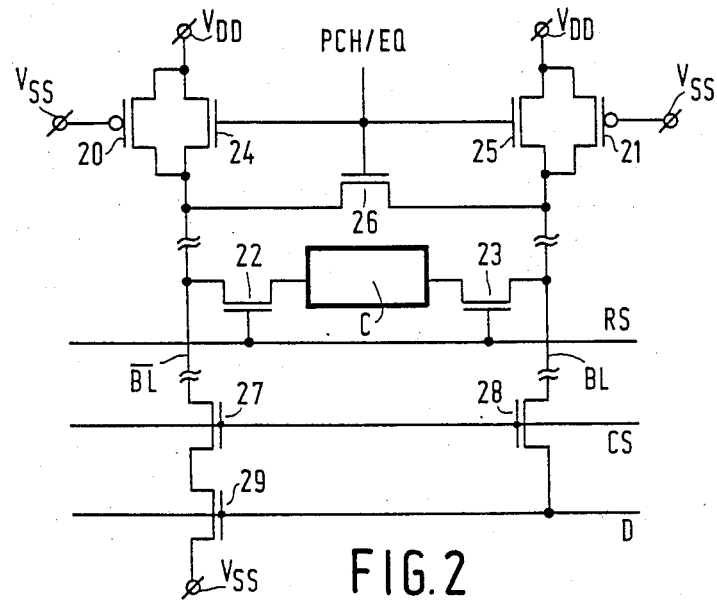
FIG. 2 shows a circuit according to the invention.

FIG. 2 shows a part of the memory circuit according to the principle of the invention. For clarity only one memory cell C of a column of memory cells is shown which can be connected to the bit lines BL and $\overline{BL}$ by means of the row selection RS via access transistors 22 and 23. The bit lines BL and $\overline{BL}$ are connected in known manner to a supply terminal $V_{DD}$ via small load transistors of the p-channel MOS type 20 and 21. Said load transistors have their control electrodes connected to the supply terminal $V_{SS}$. Two larger transistors 24 and 25 are provided parallel to transistors 20 and 21, the two bit lines BL and $\overline{BL}$ being connected to each other via a transistor 26. Both transistors 24 and 25 and transistor 26 receive a precharge/equalize signal (PCH/EQ) at their control electrodes. Transistors 24, 25 and 26 have for their object to bring the two bit lines at equal potentials under the control of the PCH/EQ signal, before information appears on the two bit lines, in order that any voltage difference between the bit lines as a result of which the information is distorted, is avoided. Transistors 24, 25 and 26 so constitute controlled balancing means. The column selection CS can make the bit lines accessible for the information on data bus D by means of the access transistors 27 and 28. Upon selection, bit line BL is connected directly to data bus D via transistor 28, while bit line $\overline{BL}$ is connected to a supply terminal $V_{SS}$ via transistor 27 and a transistor 29 whose control electrode is connected to data bus D. When data bus D conveys a logic-high signal and the column selection CS is also logic-high, the column shown is selected and the first bit line BL will remain logic-high because no discharge of the first bit line BL occurs, while the second bit line $\overline{BL}$ is discharged via the transistors 27 and 29, which in this condition are conductive, and starts to convey a logic-low signal. When data bus D conveys a logic-low signal and the column selection CS conveys a logic-high signal, bit line $\overline{BL}$ is discharged via transistor 28, while bit line BL remains logic-high due to the turning off of transistor 29 and due to the connection to $V_{DD}$ via load 20. Transistors 29 and 20, fed and controlled as shown, constitute an inverter.

Figure 3:
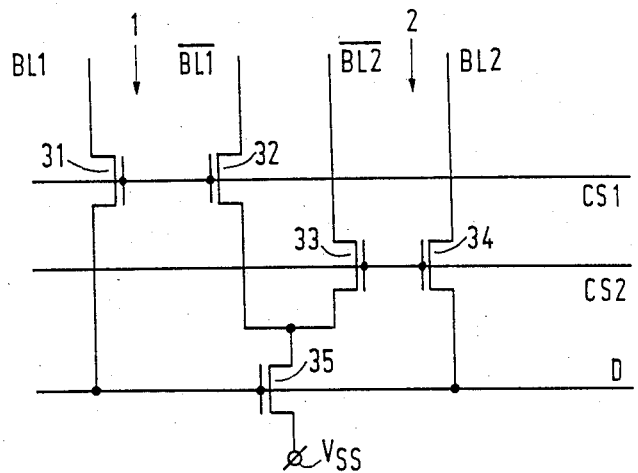
FIG. 3 shows a first embodiment of a circuit arrangement according to the invention in which the two columns have one column first transistor.

FIG. 3 shows a first embodiment of a circuit arrangement in accordance with the invention in which two columns of memory cells have one common first transistor. In order to avoid complexity of the drawing, only the equivalent of transistors 27, 28, 29 and their connections of FIG. 2 are shown for the two columns, and the memory cells, the balancing means, the bit line loads and the connections at $V_{DD}$ are not shown. The bit lines BL1 and $\overline{BL1}$ of the first column 1 and the bit lines BL2 and $\overline{BL2}$ of a second column 2 are indicated. Column 1 comprises access transistors 31 and 32 controlled by column selection signal CS1, column 2 comprises access transistors 33 and 34 controlled by column selection signal CS2. Transistors 31 and 34 connect bit line BL1 and Bit line BL2, respectively, to data bus D. Transistors 32 and 33 connect bit line $\overline{BL1}$ and bit line $\overline{BL2}$, respectively, to supply terminals $V_{SS}$ via the first transistor 35, of which latter transistor the control electrode receives the signal on data bus D. The operation of this circuit is analogous to that of the previous figure. As a result of the common use of the first transistor 35, one transistor per two columns is saved.

Figure 4:
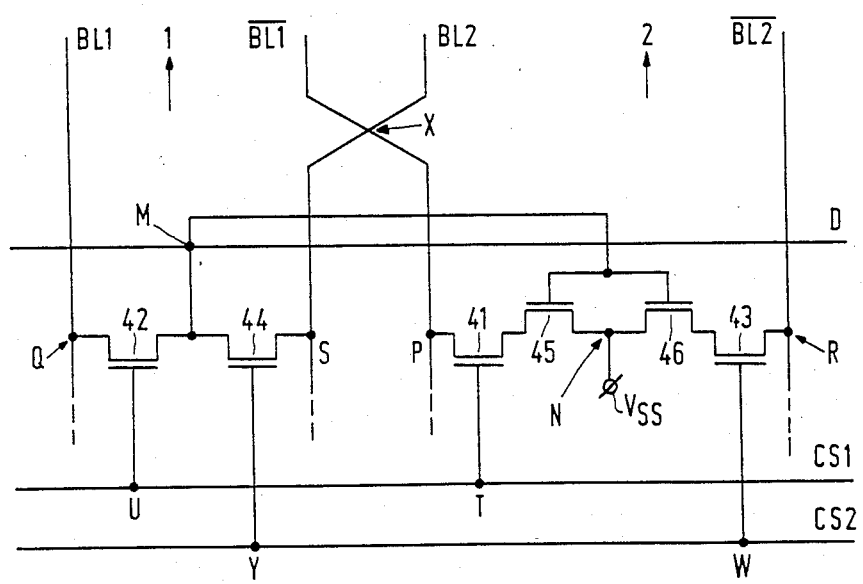
FIG. 4 shows diagrammatically a lay-out of a second embodiment of a circuit arrangement in accordance with the invention.
Figure 5:
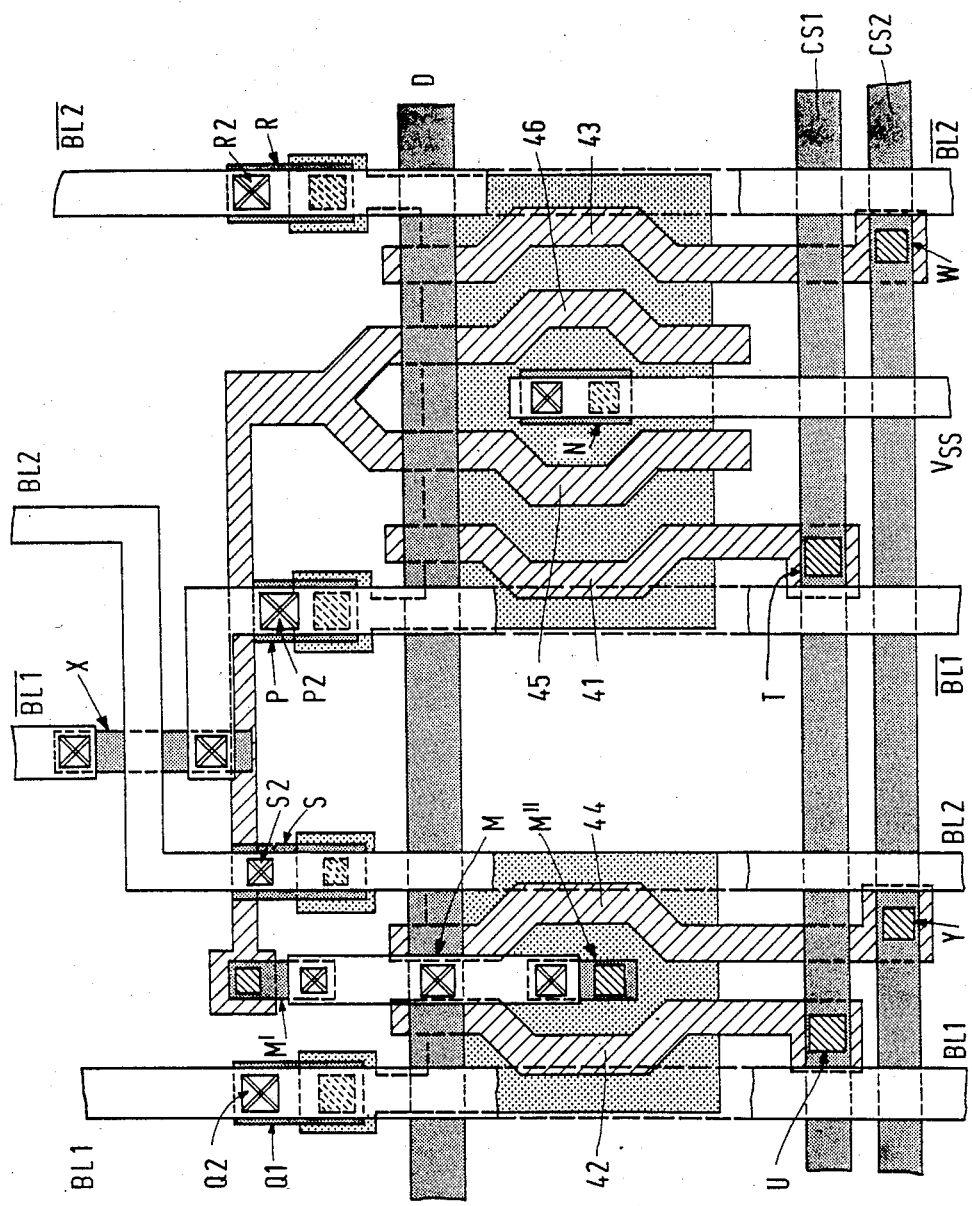
FIG. 5 shows a lay-out of the FIG. 4 embodiment.

FIG. 4 shows diagrammatically a lay-out of a second embodiment of the circuit arrangement in accordance with the invention. As in the previous figure, only the access transistors, the first transistor and the connections to the data bus and column selection per column are shown to avoid complexity of the drawing.

In this figure are shown the two columns 1 and 2, the bit lines BL1, $\overline{BL1}$, and BL2, $\overline{BL2}$, data bus D having thereon bit line connection M, column selection lines CS1 and CS2, access transistors 41, 42, 43 and 44 with their respective control electrode contacts on the column selection lines T, U, W and Y and their respective bit line contacts P, Q, R and S, first transistors 45 and 46 and the connection N thereof on the second supply terminal $V_{SS}$. In the lay-out the substrate area can advantageously be used by interweaving, per two juxtaposed columns, the access transistor circuits, the lines to contacts and the contacts themselves, on an area which is common to two columns. The gain in space with respect to a lay-out in which for each column separately an area is reserved for the access transistors, lines to contacts and the contacts themselves, is a result of the common use of contacts and the lines thereto and a larger play in the width which gives sufficient margin to realize a favorable arrangement. For this purpose, a crossing X of two bit lines, in this case BL1 and $\overline{BL2}$, is incorporated in the lay-out. In memories in which many bits are written or read parallel, substrate area is saved by arranging the pairs of memory cell columns in such a manner that the load transistors of the bit lines of one such a pair of columns are situated on a spot of the substrate in the proximity of the access transistors and first transistors of a subsequent pair of columns. The read and write means and the data lines are then spread over the chip. Such an arrangement presents the advantage that the access and first transistors can be realize per pair of memory cell columns on a substrate area having substantially four times the column width, which enables wide data buses.

Fig1. 5 shows a possible lay-out of the circuit arrangement of FIG. 4 in which corresponding elements are referred to by the same reference numerals as in FIG. 4.

The circuit arrangement is constructed in the known CMOS-two-metal-layer technology. In this case the polysilicon tracks (wide line shading) are present between on the one hand the first and second metal layers (indicated in the figure by grey and blank respectively) and on the other hand the diffusion areas (shown in broken lines).

The polysilicon tracks constitute the control electrodes of the respective access and first transistors and have the same reference numerals as in FIG. 4. The column selection lines CS1 and CS2, as well as data line D, are provided in the first metal layer. The bit lines BL1, $\overline{BL1}$, BL2, $\overline{BL2}$ and the supply line $V_{SS}$ are placed in the second metal layer. The contacts from a diffusion area or a polysilicon track to a second metal layer line (M", N, P, Q, R, S and M', respectively) extend via a first metal layer strip.

Contacts between the two metal layers are marked by a cross (for example M2, N2, P2, Q2, R2, S2). The crossing X of bit line BL2 with bit line $\overline{BL1}$ also extends via a first metal layer strip. For reasons of clarity, the bit lines in the figure are interrupted to show the underlying diffusion areas. The remaining column selection lines and data lines which in a complete lay-out are situated in the proximity of and parallel to the CS1 and CS2 lines and data lines D, respectively, are not shown in the figure.

Due to the presence of several data lines and column selection lines, contact M which effectively connects a diffusion area and a polysilicon track to a first metal layer line, extends via a second metal layer strip. For the same reason the polysilicon tracks 45 and 46 have been extended up to contact M'.

What is claimed is:

1. An integrated memory circuit in which memory cells are arranged in columns and in which each column is connected to two bit lines, and in which, for writing information into a memory cell of a column, that memory cell can be selected by means of selection means, which selection means connect the memory cell to the two bit lines and connect the two bit lines to a data bus for supplying information to the memory cell, each of the two bit lines being connected, via a respective load, to a first supply terminal, the data bus comprising a line which supplies a signal to a first bit line, inverting means being provided per column that generate a logically complementary signal on a second bit line, whereby upon selecting a column the first bit line in said column is connected to the data bus, characterized in that the inverting means comprise a single first transistor and the load on the second bit line, the first transistor having a conduction path placed between the second bit line and a second supply terminal and having a control electrode connected to said line of the data bus.

2. A memory circuit as claimed in claim 1, characterized in that upon selecting one of two juxtaposed columns the respective rsecond bit line is connected to the second supply terminal via a first transistor which is common to both columns.

3. A memory circuit as claimed in claim 1 or 2, characterized in that of two juxtaposed columns in a layout of the memory circuit a first bit line of a first column crosses a second bit line of a second column between column selection lines belonging to said two columns and an area in which all the memory cells of said two columns are present.

4. A memory circuit as claimed in claim 1 or 2, characterized in that in a lay-out of the memory circuit upon selecting one of two juxtaposed columns a respective second bit line is connected, via a respective first transistor, to the second supply terminal means of a contact point which is common to both columns.

5. A memory circuit as claimed in claim 1 or 2, characterized in that in a lay-out of the memory circuit upon selecting one of two juxtaposed columns the respective first bit line is connected to the data bus via a contact point which is common to both columns.

* * * * *